(12) United States Patent
Hemker et al.

(10) Patent No.: US 7,749,689 B2
(45) Date of Patent: Jul. 6, 2010

(54) METHODS FOR PROVIDING A CONFINED LIQUID FOR IMMERSION LITHOGRAPHY

(75) Inventors: David Hemker, San Jose, CA (US);
Fred C. Redeker, Fremont, CA (US);
John Boyd, Atascadero, CA (US); John M. de Larios, Palo Alto, CA (US);
Michael Ravkin, Sunnyvale, CA (US);
Mikhail Korolik, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/055,219

(22) Filed: Mar. 25, 2008

(65) Prior Publication Data

US 2008/0171292 A1    Jul. 17, 2008

Related U.S. Application Data

(60) Division of application No. 10/834,548, filed on Apr. 28, 2004, now Pat. No. 7,367,345, which is a continuation-in-part of application No. 10/606,022, filed on Jun. 24, 2003, now Pat. No. 7,252,097.

(51) Int. Cl.
*G03F 7/26* (2006.01)

(52) U.S. Cl. ........................ 430/322; 430/327

(58) Field of Classification Search ............... 430/311, 430/322
See application file for complete search history.

(56) References Cited

U.S. PATENT DOCUMENTS 6,809,794 B1 * 10/2004 Sewell .................... 355/30
7,198,055 B2 * 4/2007 Woods et al. ............ 134/95.2

* cited by examiner

*Primary Examiner*—Kathleen Duda
(74) *Attorney, Agent, or Firm*—Martine Penilla & Gencarella, LLP

(57) ABSTRACT

A method for processing a substrate is provided which includes generating a meniscus on the surface of the substrate and applying photolithography light through the meniscus to enable photolithography processing of a surface of the substrate.

14 Claims, 7 Drawing Sheets

METHODS FOR PROVIDING A CONFINED LIQUID FOR IMMERSION LITHOGRAPHY

CLAIM OF PRIORITY

This is a divisional application claiming 35 U.S.C. §120 priority of U.S. patent application Ser. No. 10/834,548, filed on Apr. 28, 2004, now U.S. Pat. No. 7,367,345 which is a continuation-in-part of a U.S. Ser. No. 10/606,022, now U.S. Pat. No.7,252,097, from which priority under 35 U.S.C. §120 is claimed, entitled "SYSTEM AND METHOD FOR INTEGRATING IN-SITU METROLOGY WITHIN A WAFER PROCESS" filed on Jun. 24, 2003. These aforementioned patent applications are hereby incorporated by reference.

BACKGROUND OF THE INVENTION

1. Field of the Invention

The present invention relates to semiconductor wafer processing and, more particularly, to apparatuses and techniques for more effectively conducting patterning a photoresist in a photolithographic operation.

2. Description of the Related Art

The ability to work selectively on small well defined areas of a substrate is paramount in the manufacture of semiconductor devices. In the continuing quest to achieve higher levels of performance and higher functional density of the semiconductor devices, the microelectronics industry is committed to applying new processes to further reduce the minimum feature sizes of the semiconductor devices.

Figure 1:
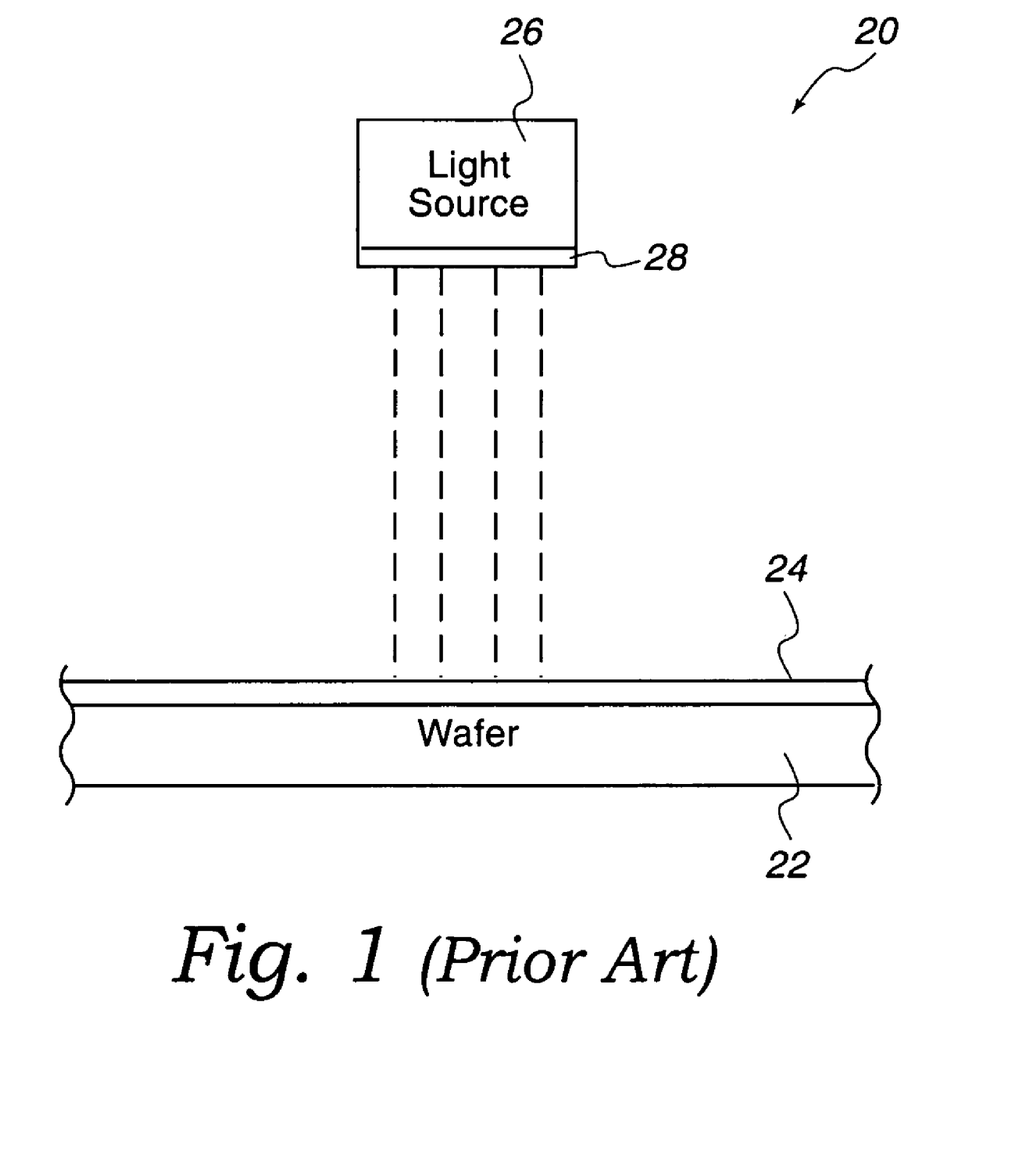
FIG. 1 shows an example of a simplified photolithographic operation.

FIG. 1 shows an example of a simplified photolithographic operation 20. In the operation 20, a light source 26 generates light which is passed through a reticle 28. Reticles are generally manufactured by depositing a chromium photomask on a glass plate that is transparent. The photomask is then typically coated with a resist, and then a pattern is defined in the resist by usage of a pattern generator. The resist is then developed after which the photomask is chemically processed to remove everything but the pattern from the glass plate. To define a pattern in the resist, the pattern generator utilizes an electron beam to generate the features in the resist. The light passed though the reticle 28 may then pattern a photoresist 24 that has been applied to a surface of the substrate 22. The photoresist may then be processed as known by those skilled in the art to generate the desired features on the substrate 22.

As feature sizes are reduced, the devices can become smaller or remain the same size but become more densely packed. As such, advances in lithographic technologies used to pattern the semiconductor devices must keep pace with the progress to reduce feature sizes, in order to allow for smaller and more dense semiconductor devices. In order to do this, the lithographic technology must increasingly improve its ability to resolve smaller and smaller line widths. The resolution limit is in good part determined by the wavelength of light used to pattern the photoresist. Therefore one of the main ways to reduce the device critical dimensions (CD) through lithographic technologies has been to continually reduce the wavelength of the radiation used to expose the photoresist to yield well-defined pattern profiles.

High resolution lithographic transmission becomes more of a challenge as wafers progress to higher density chips with shrinking geometries. Furthermore, as metallization interconnect technology transitions to dual damascene processes, lithography techniques to pattern holes or trenches in the dielectric become more critical and has a direct impact on yield and reliability. In particular, optical lithographic methods utilizing shorter wavelengths are often utilized to pattern the photoresist. For example, attempts to use wavelengths as low as 157 nm have been made. Unfortunately, present optical lithographic methods and tools have to be changed to utilize this shorter wavelength. Regrettably, to change over to the 157 nm wavelength from a higher wavelength process, optical lithographic tools must generally be changed such as using different materials for optics and different lens concepts, as well as changing the photomask materials.

Therefore, there is a need for a method and an apparatus that can utilize the same masks, resists, and lens concepts as existing systems but at the same time also provide the sharper pattern profile that results from using shorter wavelengths to pattern the photoresist.

SUMMARY OF THE INVENTION

Broadly speaking, the present invention fills these needs by providing a method and apparatus for conducting photolithography in an optimal and effective manner. It should be appreciated that the present invention can be implemented in numerous ways, including as a process, an apparatus, a system, a device or a method. Several inventive embodiments of the present invention are described below.

In one embodiment, a method for processing a substrate is provided which includes generating a fluid meniscus to process the substrate where the fluid meniscus is constantly replenished with fluid by addition of the fluid into the fluid meniscus and by removal of the fluid from the fluid meniscus by a vacuum. The method also includes applying the fluid meniscus to a photoresist on a substrate surface and transmitting a patterned light to the photoresist on the substrate surface through the fluid meniscus.

In another embodiment, an apparatus for processing a substrate is provided which includes a proximity head configured to generate a fluid meniscus to facilitate patterning of a photoresist on a substrate surface where the fluid meniscus is constantly replenished with fluid by addition of the fluid into the fluid meniscus and by removal of the fluid from the fluid meniscus by a vacuum. The apparatus also includes a lithography lens structure at least partially defined within the proximity head where the lithography lens structure has a lithography lens in direct contact with the fluid meniscus during operation. The lithography lens structure applies a patterned light from the lithography lens through the fluid meniscus to pattern the photoresist on the substrate surface.

In yet another embodiment, an apparatus for processing a substrate is provided which includes a proximity head capable of generating a fluid meniscus to process a substrate surface where the fluid meniscus is constantly replenished with fluid by addition of the fluid into the fluid meniscus and by removal of the fluid from the fluid meniscus by a vacuum. The apparatus further includes a light generating source within the proximity head where the light generating source is in direct contact with the fluid meniscus during operation. The light generating source applies a patterned light into and through the fluid meniscus. The patterned light has a first wavelength before entrance into the fluid meniscus and an effective wavelength when applied to the photoresist through the fluid meniscus where the effective wavelength is shorter than the first wavelength.

In another embodiment, a method for processing a substrate is provided which includes generating a meniscus on the surface of the substrate and applying photolithography light through the meniscus to enable photolithography processing of a surface of the substrate.

In yet another embodiment, a photolithography apparatus is provided which includes a proximity head where the proximity head is capable of generating a meniscus on a surface of a substrate. The apparatus also includes a light source for applying photolithography light from the proximity head and through the meniscus where the photolithography light contacts the surface of the substrate to enable photolithography processing.

The advantages of the present invention are numerous. Most notably, the apparatuses and methods described herein efficiently pattern photoresist in an immersion lithography operation by converting a wavelength of an optical signal to a shorter effective wavelength. The shorter effective wavelength may be generated using a proximity head with lithography lens that is capable of directly contacting a fluid meniscus for transmitting optical signals to a photoresist layer on a substrate surface through the fluid meniscus.

The proximity head with the photolithography lens can optimally manage fluid application and removal from the wafer thereby generating the fluid meniscus through which the optical signal may be sent. The fluid meniscus can be effectively moved without losing significant stability and in addition can be constantly replenished with new liquid thereby enhancing the photolithography process by significantly reducing bubbling and contamination within the fluid meniscus. Moreover, with the use the fluid meniscus as described herein, contamination left on the wafer surface can be dramatically reduced. As a result, by using the fluid meniscus that can shorten the effective wavelength of the optical signal from the lithography lens, equipment such as lens and optical apparatus generally used for longer wavelength photolithographic methods may be utilized to generate a much more precise and sharp patterning than is generally available.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

An invention for methods and apparatuses for processing a substrate is disclosed. Specifically, an efficient and effective way of patterning photoresist in a photolithographic operation is provided. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system where optimized photolithographic operations may be conducted. Specifically, the figures below illustrate embodiments of an exemplary wafer photolithographic system using proximity heads to generate a fluid meniscus in a controlled environment that includes a lithography lens structure located at least partially within a proximity head. In one embodiment, the lithography lens may contact the fluid meniscus and transmit patterned optical signals through the fluid meniscus to a photoresist that has been applied to a surface of the substrate. It should be appreciated that application of a photoresist onto a substrate is well known to those skilled in the art. By transmitting the optical signals through the fluid meniscus and applying the optical signals to the photoresist, the wavelength of the optical signal may be changed to a shorter effective wavelength thereby resulting in more precise patterning of the photoresist. Consequently, a more precise way of patterning photoresist may be utilized to generate smaller critical dimensions leading to smaller and more dense features within a semiconductor wafer.

It should be appreciated that the systems described herein are exemplary, and that any other suitable type of configuration that would enable movement of the proximity head(s) into close proximity to the wafer may be utilized. In the embodiments shown, the proximity head(s) may move in any fashion to facilitate photoresist patterning. In one embodiment, the proximity head may be configured to move in any manner typically associated with a stepper mechanism as known to those known skilled in the art. In another embodiment, the proximity head may move in a rasterized movement. In another embodiment, the proximity head(s) may be moved in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, etc. The motion may also be any suitable specified motion profile as desired by a user as long as the desired photolithographic patterning of the wafer is accomplished. In addition, the proximity head and the wafer processing system described herein may be utilized to photolithographically pattern any shape and size of substrates such as for example, 200 mm wafers, 300 mm wafers, flat panels, etc.

A fluid meniscus can be supported and moved (e.g., onto, off of and across a wafer) with a proximity head. Various proximity heads and methods of using the proximity heads are described in co-owned U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/738,164 filed on Dec. 16, 2003 entitled "Apparatus for Oscillating a Head and Methods for Implementing the Same," U.S. patent application Ser. No. 10/918,487 filed on Mar. 31, 2004 entitled "Proximity Head Heating Method and Apparatus," U.S. patent application Ser. No. 10/742,303 filed on Dec. 18, 2003 entitled "Proximity Brush Unit Apparatus and Method," U.S. patent application Ser. No. 10/816,432 filed on Mar. 31, 2004 entitled "Substrate Brush Scrubbing and Proximity Cleaning-Drying Sequence Using Compatible Chemistries, and Method, Apparatus, and System for Implementing the Same," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," and U.S. patent application Ser. No. 10/742,303 entitled "Proximity Brush Unit Apparatus and Method." The aforementioned patent applications are hereby incorporated by reference in their entirety.

It should be appreciated that the methods and apparatuses discussed herein may be utilized in any suitable wafer processing system described in the above referenced patent applications. It should also be appreciated that the lithography lens may be utilized with any suitable proximity head that can generate a stable but dynamic fluid meniscus that can contact the lithography lens to photolithographically pattern a photoresist on a wafer surface. The lithography lens as utilized herein may be any suitable type of lithographic apparatus that can transmit patterned light through the lens to pattern a photoresist. In one embodiment, the lithography lens can be a part of a lithographic lens structure that is attached to a column system to form a photolithographic light system which can include a light source, a reticle, and one or more lens.

Figure 2:
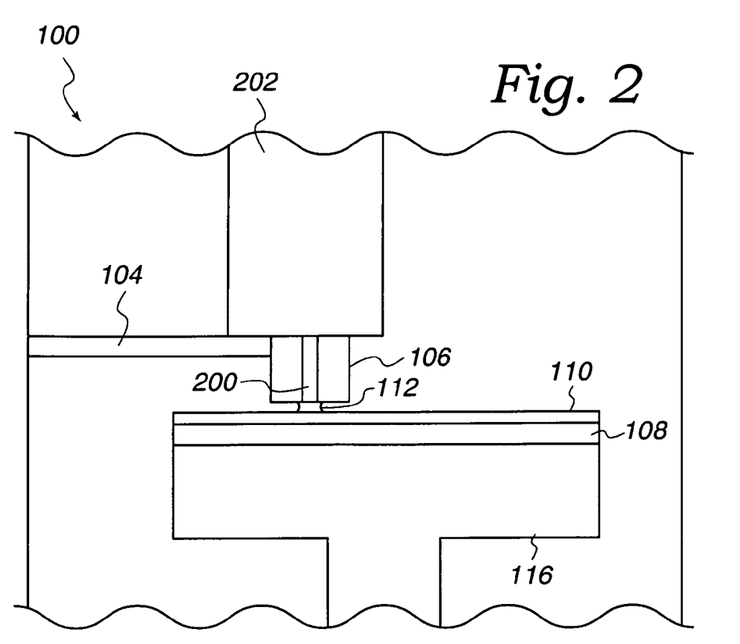
FIG. 2 shows a wafer processing system in accordance with one embodiment of the present invention.

FIG. 2 shows a wafer processing system 100 in accordance with one embodiment of the present invention. The system 100 includes a proximity head 106 which may generate a fluid meniscus 112 as discussed herein and also above in the U.S. patent applications which were incorporated by reference. In one embodiment the proximity head 106 may be held by an arm 104 and be moved into close proximity above a wafer 108 that has a photoresist 110 applied onto a top surface. The wafer 108 may have any suitable type of layers, levels, or materials underneath the photoresist 110 depending on the wafer structure(s) desired. In one embodiment, the wafer 108 may be held by a chuck 116. It should be understood that the wafer 108 may be held or supported in any other suitable manner such as, for example, by rollers holding the wafer 108 by the edges.

It should also be appreciated that the system 100 may be configured in any suitable manner as long as the proximity head(s) may be moved in close proximity to the wafer to generate and control a meniscus while patterning a photoresist layer by a lithography lens structure 200 that contacts the fluid meniscus 112. The lithography lens structure 200 is described in further detail in reference to FIGS. 3A through 4C. It should also be understood that close proximity may be any suitable distance from the wafer as long as a meniscus may be maintained and patterning of the photoresist may occur. In one embodiment, the proximity head 106 (as well as any other proximity head described herein) may be located between about 0.1 mm to about 10 mm from the wafer 108 to generate the fluid meniscus 112 on the wafer surface. In a preferable embodiment, the proximity head 106 (as well as any other proximity head described herein including the proximity head configurations described in the U.S. Patent Applications referenced above) may each be located about 0.5 mm to about 4.5 mm from the wafer to generate the fluid meniscus 112 on the wafer surface, and in preferable embodiment, the proximity head 106 may be located about 2 mm from the wafer to generate the fluid meniscus 112 on the wafer surface.

In one embodiment, the system 100, the proximity head 106 may be moved from patterned to unpatterned portions of the photoresist that has been applied to the wafer 108. It should be appreciated that the proximity head 106 may be movable in any suitable manner that would enable movement of the proximity head 106 to pattern the photoresist layer on the wafer 108 as desired as discussed above. The proximity head 106 of the wafer processing system 100 may also be any suitable size or shape as shown by, for example, any of the proximity heads as described herein including those described in the patent applications incorporated by reference above. The different configurations described herein can therefore generate a fluid meniscus between the proximity head and the wafer, and in addition, the lithography lens structure 200 may apply a patterning light (also known as patterned light) onto the photoresist 110 through a lens that is in direct contact with the fluid meniscus 112. Once the light moves directly from the lens to the fluid meniscus 112, depending on the refractive index of the fluid, the effective wavelength of the light may be a much shorter effective wavelength that the wavelength of the light before entrance into the fluid meniscus. It should be appreciated that any suitable liquid that may shorten the effective wavelength of the light applied from the lithography lens may be used such as, for example, water, aqueous solutions of sucrose, maltose, or chloride salts, etc. By positioning the fluid meniscus in direct contact with the lens and the photoresist, refraction at the meniscus-lens interface and the liquid-photoresist interface are significantly reduced or eliminated. This may enable the patterned light from the lens of the lithography lens to move through the meniscus without refraction which can reduce the effective wavelength of the patterned light using the formula as indicated in Table 1 below.

TABLE 1

$$\lambda_{\text{effective}} = \frac{\lambda}{\text{refractive index}}$$

In the above equation, $\lambda$ is the wavelength of the patterned light before entry into the fluid meniscus and $\lambda_{\text{effective}}$ is the effective wavelength of the patterned light that is applied to the photoresist on a wafer surface. In one embodiment, water may be utilized as the fluid for the immersion lithography. Water has a refractive index of 1.43 and therefore, if the lithography lens applies a wavelength of 193 nm to the fluid meniscus, the effective wavelength of the optical signal applied to the photoresist may be shortened to about 135 nm. Therefore, by using a configuration where the lithography lens directly contacts the liquid of the fluid meniscus, the effective wavelength of light from the lithography lens may be decreased significantly. The decreased effective wavelength light hitting the photoresist on the wafer surface may pattern the photoresist into any suitable pattern desired. It should be appreciated that the light from a light source may be sent through a reticle which may generate the pattern desired. The light source may be any suitable apparatus that may generate an optical signal that can pattern a photoresist such as, for example, a UV lamp, an excimer laser, etc. The reticle may be generated by any suitable method as known to those skilled in the art.

In one embodiment, the lithography lens structure 200 is attached to a patterned light generating apparatus such as, for example, the column system 202 as shown in FIG. 2. The column system 202 may be any suitable apparatus that has the light source and the reticle where unpatterned light from the light source may be transmitted through the reticle to generate the patterned light for transmission through the lithography lens structure 200 for patterning of the photoresist 110. It should be appreciated that lithography lens structure 200 may be any suitable structure of any suitable configuration and/or size that is at least partially definable within the proximity head that can also facilitate transmission of the patterned light signal from the column system 202 to the fluid meniscus 112. In one embodiment, the patterned light can be transmitted from the column system 202 through the lens of the lithography lens structure 200 directly to the fluid meniscus 112. From there, the patterned light can travel through the fluid meniscus 112 to the photoresist 110 on the surface of the wafer 108. The patterned light can then applied to the photoresist 110 so the pattern is imposed on the photoresist 110. Therefore, in one embodiment, the lithography lens structure 200 can include one or more lens within a passage that extends through the lithography lens structure 200 so light transmission from a top portion the proximity head 106 to a bottom portion of the proximity head 106 is generated. It should be appreciated that the patterned light may be generated in any suitable fashion and the embodiments described herein are merely exemplary in nature.

The fluid meniscus may be moved across the wafer to process the wafer by applying fluid to the wafer surface and removing fluids from the surface while at the same time applying a patterning light to the photoresist on the wafer surface. In one embodiment, a stepper apparatus may be used to move the lithography lens over portions of the wafer to be patterned. The wafer 108 may also be moved in a rasterized motion as the photolithographic patterning operation progresses. It should also be appreciated that the system 100 may process one surface of the wafer or both the top surface and the bottom surface of the wafer.

In one embodiment, the fluid meniscus 112 may be generated by applying fluids to the wafer surface and removing the fluids from the wafer surface through conduits such as the source inlets and source outlets located in the proximity head as described herein. It should be appreciated that conduits such as, for example, inlets and outlets, may have openings located on a face of the proximity head and may be in any suitable configuration as long as a stable meniscus as described herein may be utilized.

In one exemplary embodiment, at least one gas inlet may be adjacent to at least one vacuum outlet which may be in turn adjacent to at least one processing fluid inlet to form an gas-vacuum-processing fluid orientation. It should be appreciated that other types of orientations such as gas-processing fluid-vacuum, processing fluid-vacuum-gas, vacuum-gas-processing fluid, etc. may be utilized depending on the wafer processes desired and what type of wafer processing mechanism is sought to be enhanced. In another embodiment, the gas-vacuum-processing fluid orientation may be utilized to intelligently and powerfully generate, control, and move the meniscus located between a proximity head and a wafer to process wafers. By having the ability to manage the fluid meniscus, the lithography lens may be kept in a position so the liquid/lens interface and the liquid/photoresist interface can reduce the effective wavelength of the optical signal being applied to the photoresist.

The processing fluid inlets, the gas inlets, and the vacuum outlets may be arranged in any suitable manner if the fluid meniscus may be generated and maintained in a stable manner. For example, in addition to the gas inlet, the vacuum outlet, and the processing fluid inlet, in an additional embodiment, there may be additional sets of gas inlets, processing fluid inlets and/or vacuum outlets depending on the configuration of the proximity head desired. It should be appreciated that the exact configuration of the gas-vacuum-processing fluid orientation may be varied depending on the application. For example, the distance between the gas inlet, vacuum, and processing fluid inlet locations may be varied so the distances are consistent or so the distances are inconsistent. In addition, the distances between the gas inlet, vacuum, and processing fluid inlet may differ in magnitude depending on the size, shape, and configuration of the proximity head 106 and the desired size of a process meniscus (i.e., meniscus shape and size). Moreover, exemplary gas-vacuum-processing fluid orientation may be found as described in the U.S. Patent Applications referenced above.

In one embodiment, the proximity head 106 may be positioned in close proximity to a top surface of the wafer 108 and may utilize the gas and processing fluid inlets and a vacuum outlet(s) to generate wafer processing meniscuses in contact with the wafer 108 which are capable of processing the top surface. The wafer processing meniscus may be generated in accordance with the descriptions in reference to Applications referenced and incorporated by reference above. In one embodiment, IPA/N$_2$ vapor gas may be inputted as the gas through the gas inlet and deionized water may be inputted as the processing fluid through the processing fluid inlet. At substantially the same time the IPA and the processing fluid are inputted, a vacuum may be applied in close proximity to the wafer surface to remove the IPA vapor, the processing fluid, and/or the fluids that may be on the wafer surface. It should be appreciated that although IPA is utilized in the exemplary embodiment, any other suitable type of vapor may be utilized such as for example, any suitable vapor of alcohols (ethanol, propanol, butanol, hexanol etc.), ketones, ethers, or other organic compounds, etc. that may be miscible with the liquid being used to generate the fluid meniscus the vapor of which can be carried via an inert gas. The portion of the processing fluid that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

In one embodiment, the system 100 further includes a fluid supply distributor that can supply to, and remove fluids from, the proximity head 106. It should be appreciated that the fluid supply distributor may be any suitable apparatus that can supply and receive fluids in an controlled manner such as, for example, a manifold. In one embodiment, the fluid supply distributor receives fluid from a fluid supply. The fluid supply may be managed and controlled by a fluid supply control which may be any suitable hardware/software that can manage fluid input to the proximity head 106. The proximity head 106 may then produce the meniscus 112 that can process the wafer 108.

Figure 3A:
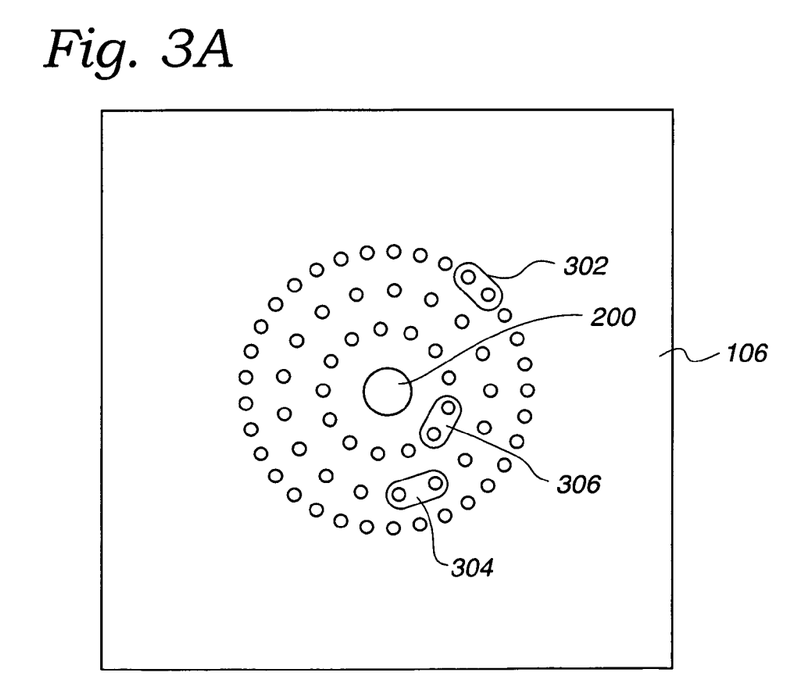
FIG. 3A illustrates a proximity head with lithography lens structure in accordance with one embodiment of the present invention.

FIG. 3A illustrates a proximity head 106 with the lithography lens structure 200 in accordance with one embodiment of the present invention. As discussed above, the lithography lens 200 may be connected to any suitable apparatus that can generate the patterned light which can pattern a photoresist on a wafer surface. In one embodiment, as shown in FIG. 2, the patterned light generating apparatus is the column system 202 that can be attached to a top portion of the lithography lens structure 200. The lithography lens structure 200 may include a lens capable of directly contacting the fluid meniscus to transmit the patterned light to the photoresist through the fluid meniscus. In one embodiment, the lens may be made from any suitable material that can transmit the desired wavelength of light, such as, for example, CaF2, quartz, etc.

In one embodiment, the proximity head 106 includes inlets 302 and 306 as well as outlets 304. In an exemplary embodiment of an immersion lithography operation, the proximity head 106 may produce a fluid meniscus through which the lithography lens structure 200 may pass a patterning light to pattern the photoresist that is on the surface of the wafer 108 (as discussed in further detail in reference to FIGS. 3B and 3C). The inlets 302 and 306 may input any suitable surface tension reducing gas/vapor and processing fluid respectively depending on the specific wafer processing operation desired. An outlet 304 may generate a vacuum which can remove any suitable amount of the surface tension reducing gas and the processing fluid (as well as any other fluid on the wafer 108) from a surface of the wafer 108. As a result, the proximity head 106 can enable the generation of the fluid meniscus as described herein to create a fluid medium through which a patterning light may be transmitted. In such an exemplary embodiment, the proximity head 106 may process the wafer 108 so a pattern as defined by the reticle inside of a column structure may be transferred to the photoresist by passing the patterned light through the lens of the lithography lens structure 200. The lens may be in direct contact with the fluid meniscus so the patterned light from the lens may be transmitted into and through the fluid meniscus to the photoresist which may be in direct contact with the fluid meniscus generated by the proximity head 106. When the patterned light moves from the lithography lens to the fluid meniscus, the refractive index of the fluid meniscus may reduce the effective wavelength of the patterned light that is applied to the photoresist.

It should be appreciated that in another embodiment of the proximity head 106, the inlets 302 may be eliminated so just the inlets 306 and outlets 304 remain. In such a configuration, the region where the outlets 304 and inlets 306 are located may be indented as compared with the rest of the processing surface of the proximity head 106. Consequently, the fluid meniscus may be contained within the indented region without the need to apply a confinement gas and/or a surface tension altering gas. Therefore, a processing fluid may be inputted through the inlets 306 and the processing fluid may be removed through the outlets 304 to generate a stable meniscus through which photolithography may take place.

Figure 3B:
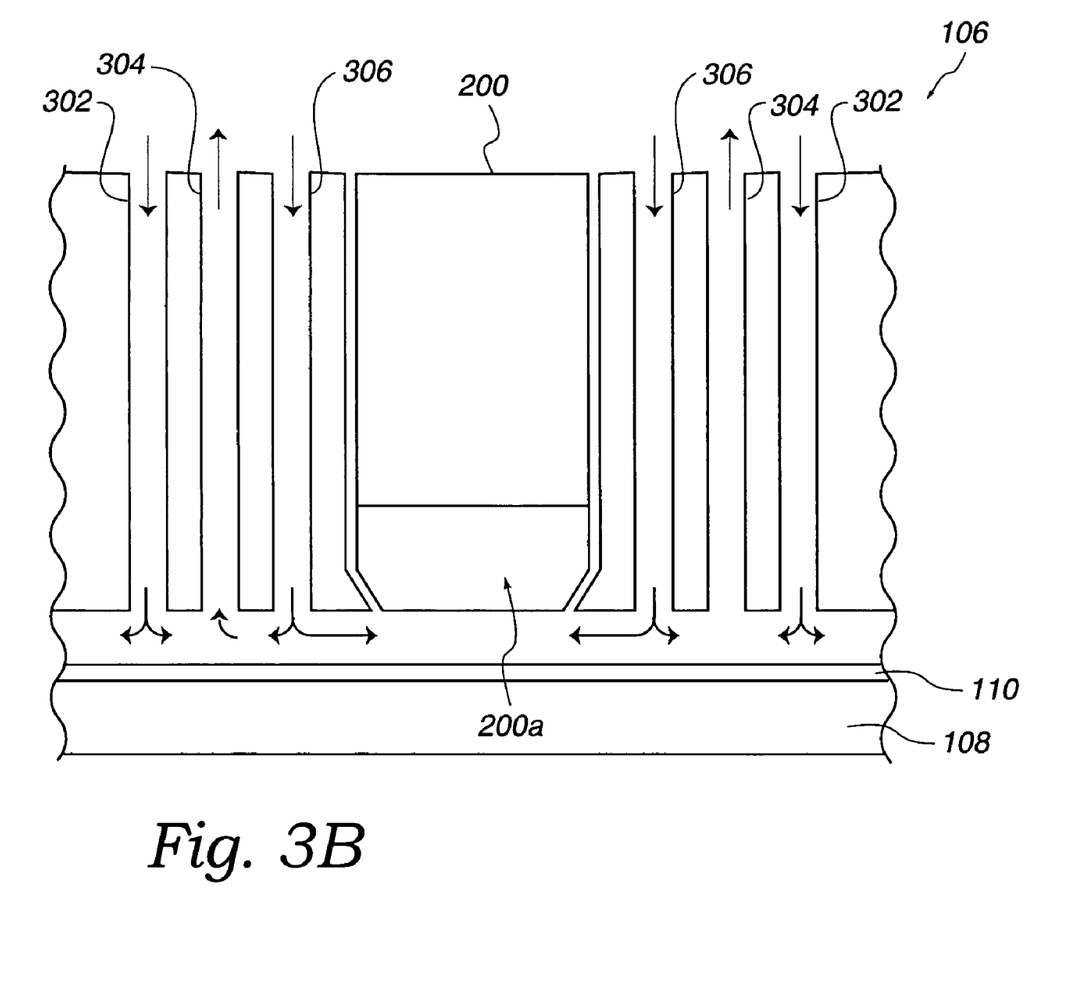
FIG. 3B shows a side view of an internal structure of the proximity head in accordance with one embodiment of the present invention.

FIG. 3B shows a side view of an internal structure of the proximity head 106 in accordance with one embodiment of the present invention. In one embodiment, the proximity head 106 includes source inlets 302 and 306 as well as a source outlet 304. In one embodiment, as the processing fluid such as, for example, deionized water (DIW) is applied against the wafer surface through the source inlets 306, the fluid forms the fluid meniscus that may be confined by the application of a gas such as, for example, IPA/$N_2$ through the source inlets 302 and the vacuum 304 that removes the IPA/$N_2$ and DIW. The fluid meniscus contacts both a lens of the lithography lens structure 200 and the photoresist on the wafer surface to provide a medium through which the patterning light from the lithography lens structure 200 may be applied to the photoresist. In one embodiment, the lithographic lens structure 200 includes a lens 200a that can transmit the patterned light from the column system directly to the fluid meniscus. As discussed above, the source inlet 302 may input any suitable type of gas that can reduce the surface tension of the liquid that makes up the fluid meniscus. In one embodiment, the gas generates a surface tension gradient at a liquid/gas border of the fluid meniscus. In one embodiment, the gas is a suitable vapor of a tensioactive fluid such as those from the group of alcohols, ketones, or other organic compounds with tensioactive properties that may be miscible with the liquid being used to generate the fluid meniscus. In a preferable embodiment, the gas is an isopropyl alcohol vapor in nitrogen gas (IPA/$N_2$). In such an embodiment, the IPA/$N_2$ can reduce the surface tension of liquids such as, for example, water. Therefore, because in one embodiment, DIW within the fluid meniscus is being constantly replenished, the wafer surface may be kept in a substantially clean state during the lithographic operation. In addition, the hardware forming and maintaining the fluid meniscus may be configured so bubbling within the fluid meniscus may be kept at a minimum or eliminated all together thereby optimizing the patterning operation. In such a fashion, a stable meniscus may be generated that does not leave contamination on the wafer surface because the water/gas eliminates the water beading effect that can leave contaminants on the wafer surface, thereby leaving a dry clean surface after processing.

In a further embodiment, the fluid meniscus may be maintained at a tightly controlled temperature to control the effective wavelength; additionally, the temperature can be lowered to increase the refractive index of the fluid, and hence lowering the effective wavelength.

Figure 3C:
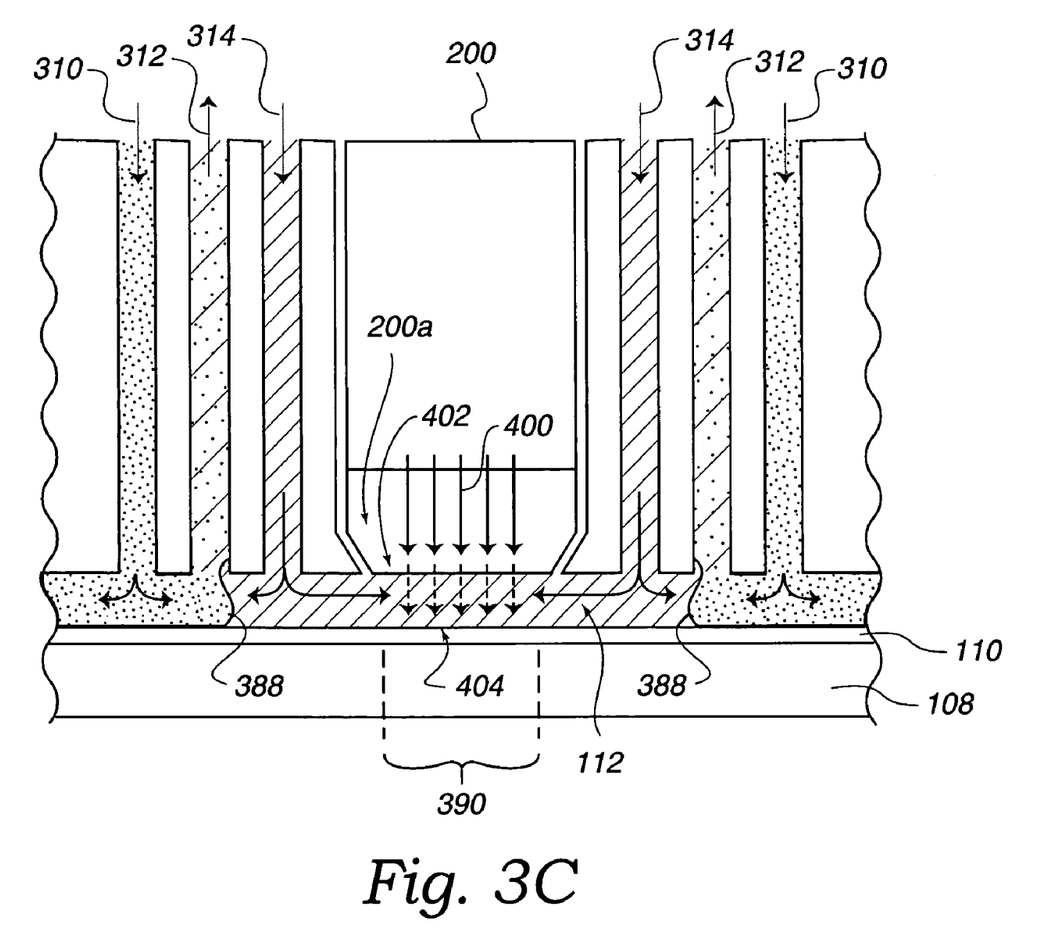
FIG. 3C shows the proximity head in operation in accordance with one embodiment of the present invention.

FIG. 3C shows the proximity head 106 in operation in accordance with one embodiment of the present invention. In this embodiment, the proximity head 106 is in operation and has generated a fluid meniscus 112 with a liquid/gas interface 388. In one embodiment, a liquid with a refractive index that can reduce the effective wavelength of light from the lithography lens structure 200 such as, for example, deionized water (DIW) is inputted as shown by direction arrow 314. In addition, a gas vapor such as, for example, a tensioactive gas like IPA/N$_2$, may be inputted as shown by direction arrow 310. The DIW and the IPA/N$_2$ may be removed from the photoresist on the wafer surface as shown by direction arrow 312. In one embodiment, a vacuum is applied thereby removing the DIW and the IPA/N$_2$. By this method, the fluid meniscus 112 may be generated on the wafer surface through which the lithography lens structure 200 may apply a patterned light 400. Because the lens 200a of the lithography lens structure 200 contacts the fluid meniscus 112 and the fluid meniscus 112 contacts the photoresist, the refractive index of the liquid making up the fluid meniscus 112 may reduce the effective wavelength of the patterned light 400 that is applied from the lithography lens structure 200 to the photoresist 110. In such an embodiment, the lens 200a of the lithography lens structure 200 forms a lens/liquid interface 402 with the fluid meniscus 112 and the fluid meniscus 112 in turn forms a liquid-photoresist interface 404 with the photoresist 110. Consequently, the patterned light 400 can travel from the lithography lens structure 200 through the meniscus to the photoresist to pattern a region 390 of the photoresist 110 on the wafer 108.

Figure 4A:
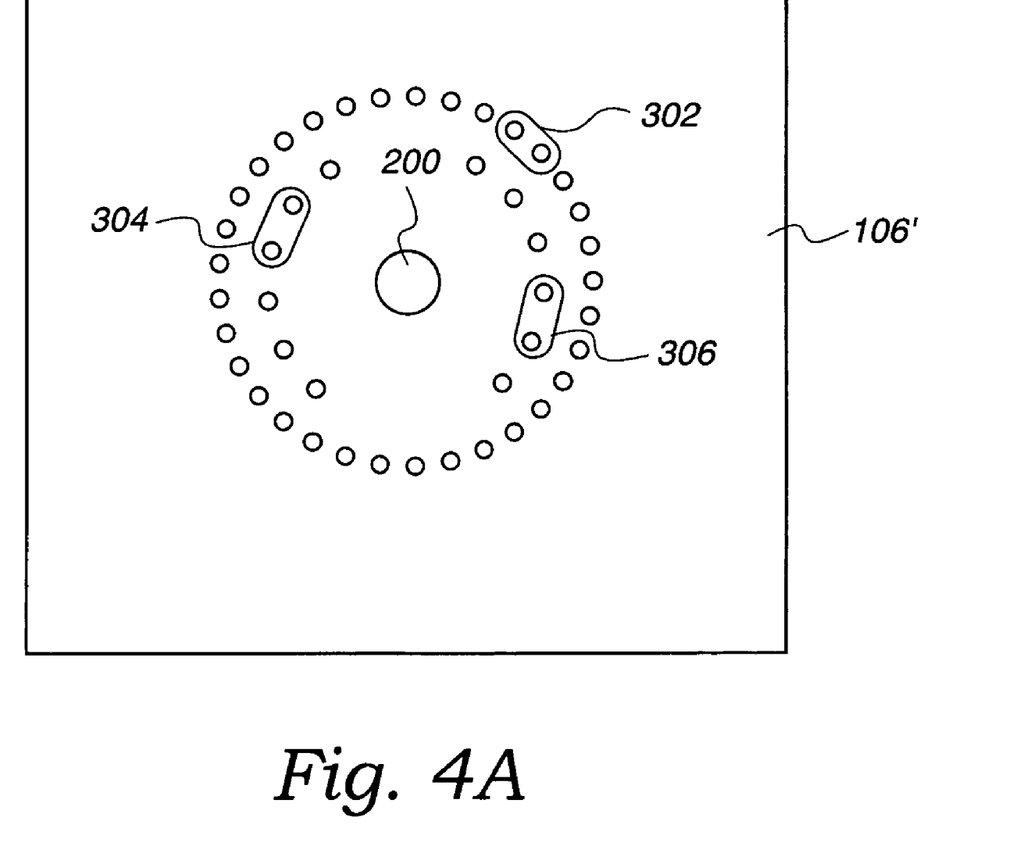
FIG. 4A illustrates a proximity head with an alternative exemplary inlet/outlet configuration in accordance with one embodiment of the present invention.

FIG. 4A illustrates a proximity head 106' with an alternative exemplary inlet/outlet configuration in accordance with one embodiment of the present invention. In one embodiment, the proximity head 106' includes the lithography lens structure 200 with source inlets 306 on one side of the proximity head 106'. The proximity head 106' also includes source outlets 304 on the other side of the lithography lens structure 200. In one embodiment, source inlets 302 may substantially surround the lithography lens structure 200, the source inlets 302, and the source outlets 304.

Figure 4B:
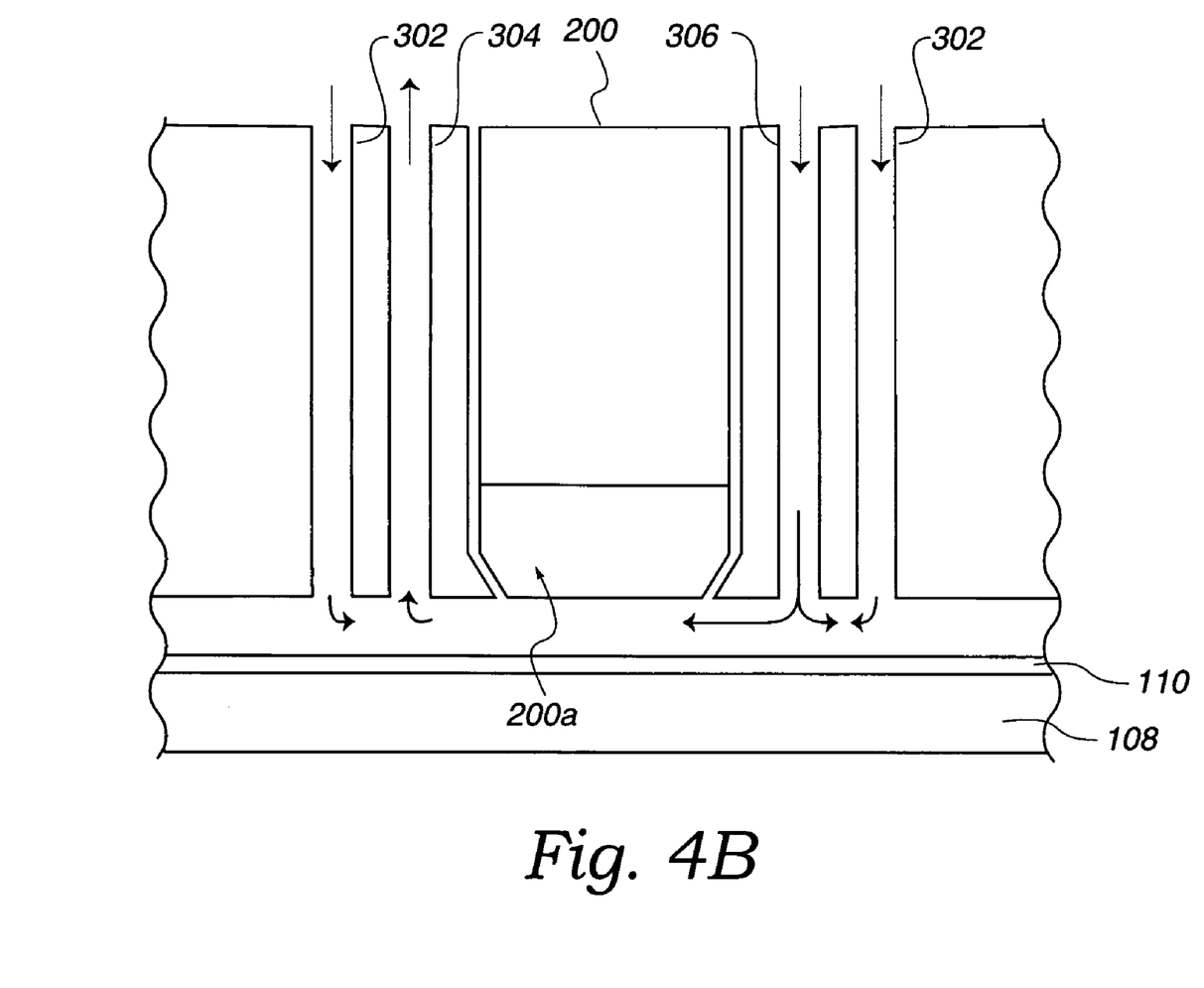
FIG. 4B shows a side view of an internal structure of the proximity head with the alternative exemplary inlet/outlet configuration in accordance with one embodiment of the present invention.

FIG. 4B shows a side view of an internal structure of the proximity head 106' with the alternative exemplary inlet/outlet configuration in accordance with one embodiment of the present invention. In one embodiment, the proximity head 106' includes the lithography lens structure 200 that includes the lens 200a that can transmit the patterned light generated by the column system that can be attached to a top portion of the lithography lens structure 200. The patterned light corresponds to the pattern desired to be generated on the photoresist on the wafer surface to be processed. The proximity head 106' may include source inlets 302 and 306 on one side of the lithography lens structure 200 with a source inlet 302 and source outlet 304 on the other side of the lithography lens structure 200. In such a configuration, liquid inputted through the source inlet 306 may be applied against the photoresist layer on the wafer surface. The source inlets 302 may apply gas to the wafer surface which in effect applies the gas against the liquid from the source inlet 306 so the liquid from the source inlets 302 may be contained. The source outlet 304 may remove the liquid from the source inlets 302 as well as some of the gas from the source inlet 302 that is on the same side as the source outlet 304. This embodiment therefore also generates a stable fluid meniscus that facilitates the lithography operations described herein.

Figure 4C:
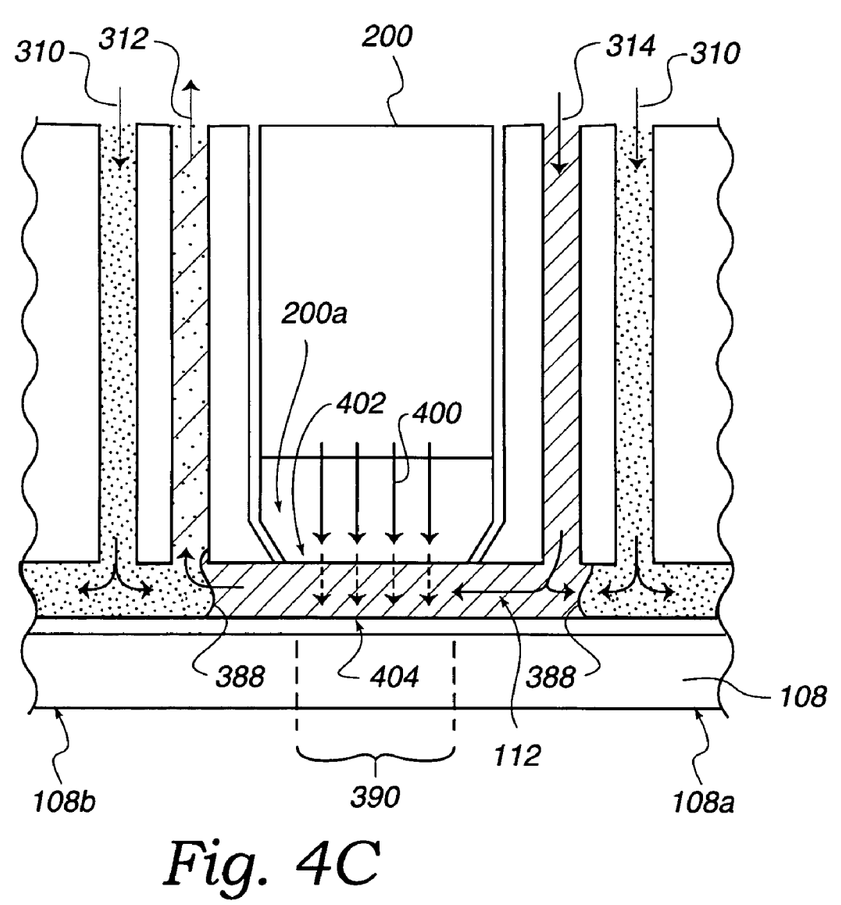
FIG. 4C shows the proximity head conducting lithographic operations in accordance with one embodiment of the present invention.

FIG. 4C shows the proximity head 106' conducting lithographic operations in accordance with one embodiment of the present invention. In one embodiment, the proximity head 106' has generated the fluid meniscus 112 with the liquid/gas interface 388. In one embodiment, a liquid with a refractive index that can reduce the effective wavelength of light from the lithography lens structure 200 such as, for example, deionized water (DIW) is inputted as shown by direction arrow 314. In addition, a surface tension reducing gas such as, for example, IPA/N$_2$, may be inputted as shown by direction arrow 310. The DIW and the IPA/N$_2$ may be removed from the photoresist on the wafer surface as shown by direction arrow 312. By this method, a dynamic fluid meniscus may be generated on the wafer surface through which the lithography lens structure 200 may apply a patterned light 400. The patterned light 400 may move from the lithography lens structure 200 to the photoresist through the fluid meniscus. Because the lithography lens structure 200 contacts the fluid meniscus 112, the refractive index of the liquid making up the fluid meniscus 112 may reduce the effective wavelength of the patterned light 400 from the lithography lens structure 200. The patterned light 400 whose effective wavelength has been reduced may pattern the region 390 of the photoresist on the wafer surface. In such an embodiment, the lens 200a of the lithography lens structure 200 may form the lens-liquid interface 402 with the fluid meniscus 112 and the fluid meniscus 112 may in turn form the liquid-photoresist interface 404 with the photoresist 110. Consequently, the patterned light 400 can travel from the lithography lens structure 200 through the meniscus to the photoresist to pattern a region 390 of the photoresist on the wafer 108.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for processing a substrate, comprising:
   generating a fluid meniscus to process the substrate, the fluid meniscus being constantly replenished with fluid by addition of the fluid into the fluid meniscus and by removal of the fluid from the fluid meniscus by a vacuum;
   applying the fluid meniscus to a photoresist on a substrate surface;
   applying a tension reducing gas to substantially confine the fluid meniscus; and
   transmitting a patterned light to the photoresist on the substrate surface through the fluid meniscus.

2. A method for processing a substrate as recited in claim 1, wherein transmitting the patterned light includes transmitting an unpatterned light through a reticle to generate the patterned light.

3. A method for processing a substrate as recited in claim 1, wherein transmitting the patterned light includes transmitting the patterned light from a lithography lens to the fluid meniscus while the lithography lens is in direct contact with the fluid meniscus.

4. A method for processing a substrate as recited in claim 1, wherein applying the fluid meniscus to the photoresist includes,
   applying the fluid to the photoresist through a first inlet of a proximity head;
   applying a gas to the photoresist through a second inlet of the proximity head, the fluid meniscus being confined by the application of the gas, wherein the gas is the tension reducing gas; and
   removing the fluid and the gas from the photoresist through an outlet of the proximity head.

5. A method for processing a substrate as recited in claim 4, wherein the gas promotes a surface tension gradient at a liquid/gas border of the fluid meniscus.

6. A method for processing a substrate as recited in claim 4, wherein the fluid and the gas is removed from a surface of the photoresist through the outlet by applying the vacuum through the outlet.

7. A method for processing a substrate as recited in claim 4, wherein the fluid is deionized water (DIW) and the tension reducing gas is an isopropyl alcohol/nitrogen (IPA/$N_2$) vapor gas.

8. A method for processing a substrate as recited in claim 1, wherein the fluid has a refractive index greater than 1.

9. A method for processing a substrate as recited in claim 1, wherein the patterned light has a first wavelength before entering the fluid meniscus, and the patterned light when transmitted through the fluid meniscus and applied to the photoresist has a effective wavelength shorter than the first wavelength.

10. A method for processing a substrate, comprising:
 generating a meniscus on a surface of the substrate;
 applying a tension reducing gas to substantially confine the meniscus on the surface of the substrate; and
 applying photolithography light through the meniscus to enable photolithography processing of the surface of the substrate.

11. A method for processing a substrate as recited in claim 10, wherein applying the photolithography light through the meniscus includes transmitting an unpatterned light through a reticle to generate the photolithography light.

12. A method for processing a substrate as recited in claim 10, wherein applying the photolithography light includes transmitting the photolithography light from a lithography lens through the meniscus while the lithography lens is in direct contact with the meniscus.

13. A method for processing a substrate as recited in claim 10, wherein generating a meniscus on the surface of the substrate includes,
 applying a fluid to the surface of the substrate through a first inlet of a proximity head,
 applying tension reducing gas to the surface of the substrate through a second inlet of the proximity head, the fluid meniscus being confined by the application of the tension reducing gas, and
 removing the fluid and an amount of the tension reducing gas from the photoresist through an outlet of the proximity head.

14. A method for processing a substrate as recited in claim 13, wherein the tension reducing gas promotes a surface tension gradient at a liquid/gas interface of the meniscus.

* * * * *